United States Patent
Wu

(10) Patent No.: US 12,278,634 B2
(45) Date of Patent: Apr. 15, 2025

(54) RESISTANCE TRACKING CIRCUIT AND OSCILLATOR CIRCUIT

(71) Applicant: Nuvoton Technology Corporation, Hsinchu Science Park (TW)

(72) Inventor: Yen-Hung Wu, Hsinchu (TW)

(73) Assignee: NUVOTON TECHNOLOGY CORPORATION, Hsinchu Science Park (TW)

(*) Notice: Subject to any disclaimer, the term of this patent is extended or adjusted under 35 U.S.C. 154(b) by 202 days.

(21) Appl. No.: 18/308,360

(22) Filed: Apr. 27, 2023

(65) Prior Publication Data

US 2024/0171158 A1    May 23, 2024

(30) Foreign Application Priority Data

Nov. 18, 2022  (TW) .................................. 111144115

(51) Int. Cl.
  *H03K 3/0231* (2006.01)
  *H03K 3/011* (2006.01)
  *H03K 5/24* (2006.01)
(52) U.S. Cl.
  CPC ........... *H03K 3/0231* (2013.01); *H03K 3/011* (2013.01); *H03K 5/249* (2013.01)

(58) Field of Classification Search
  CPC .... H03K 3/0231; H03K 3/011; H03K 3/0233; H05K 5/249
  See application file for complete search history.

(56) References Cited

U.S. PATENT DOCUMENTS 8,665,005 B2 * 3/2014 Gerna .................... H02M 3/156
                                                              327/512
2021/0328548 A1 * 10/2021 Nakatani .................... G05F 3/26

* cited by examiner

*Primary Examiner* — Jeffrey M Shin
(74) *Attorney, Agent, or Firm* — Muncy, Geissler, Olds & Lowe, P.C.

(57) ABSTRACT

A resistance tracking circuit coupled to a comparator circuit is provided. The comparator circuit generates a first current and a second current according to a first control signal and a second control signal. A variable resistor generates a first reference voltage according to the first current. A capacitor generates the output voltage according to the second current. The resistance tracking circuit includes a first conversion circuit which generates the second control signal according to a third control signal, and a copy circuit including a current circuit, a second conversion circuit, and a comparator. The third current circuit generates a third current according to the first control signal. The third current is equal to the first current. The second conversion circuit provides a second reference voltage according to the third current. The comparator compares the first reference voltage and the second reference voltage to generate the third control signal.

20 Claims, 4 Drawing Sheets

RESISTANCE TRACKING CIRCUIT AND OSCILLATOR CIRCUIT

CROSS REFERENCE TO RELATED APPLICATIONS

This application claims priority of Taiwan Patent Application No. 111144115, filed on Nov. 18, 2022, the entirety of which is incorporated by reference herein.

BACKGROUND OF THE INVENTION

Field of the Invention

The present invention relates to a tracking circuit, and, in particular, to a resistance tracking circuit.

Description of the Related Art

Generally, a comparator circuit provides an output voltage to operate a load. The load runs on the output voltage. The output voltage is usually maintained at a fixed value. However, different loads may need different voltages. Therefore, a single comparator circuit cannot be used with different loads.

BRIEF SUMMARY OF THE INVENTION

In accordance with an embodiment of the disclosure, a resistance tracking circuit is coupled to a comparator circuit. The comparator circuit comprises a first current circuit, a second current circuit, a variable resistor, and a capacitor. The first current circuit generates a first current according to a first control signal. The second current circuit generates a second current according to a second control signal. The variable resistor generates a first reference voltage according to the first current. The capacitor is charged according to the second current to generate an output voltage. The resistance tracking circuit comprises a first conversion circuit and a copy circuit. The first conversion circuit generates the second control signal according to a third control signal. The copy circuit copies the first current, generates the third control signal, and comprises a third current circuit, a second conversion circuit, and a comparator. The third current circuit generates a third current according to the first control signal. The third current is equal to the first current. The second conversion circuit provides a second reference voltage according to the third current. The comparator compares the first reference voltage and the second reference voltage to generate the third control signal.

In accordance with another embodiment of the disclosure, an oscillator circuit generates a clock signal and comprises a regulation circuit, a shaping circuit, and a comparator circuit. The regulation circuit generates an adjustment signal according to a first reference voltage to adjust an output voltage. The shaping circuit generates the clock signal according to the adjustment signal. The comparator circuit provides the first reference voltage and the output voltage and comprises a first current circuit, a second current circuit, a variable resistor, a capacitor, and a resistance tracking circuit. The first current circuit generates a first current according to a first control signal. The second current circuit generates a second current according to a second control signal. The variable resistor generates the first reference voltage according to the first current. The capacitor is charged by the second current to generate the output voltage. The resistance tracking circuit tracks the resistance of the variable resistor to generate the second control signal and comprises a copy circuit and a conversion circuit. The copy circuit copies the first current and generating a third control signal. The conversion circuit generates the second control signal according to the third control signal.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
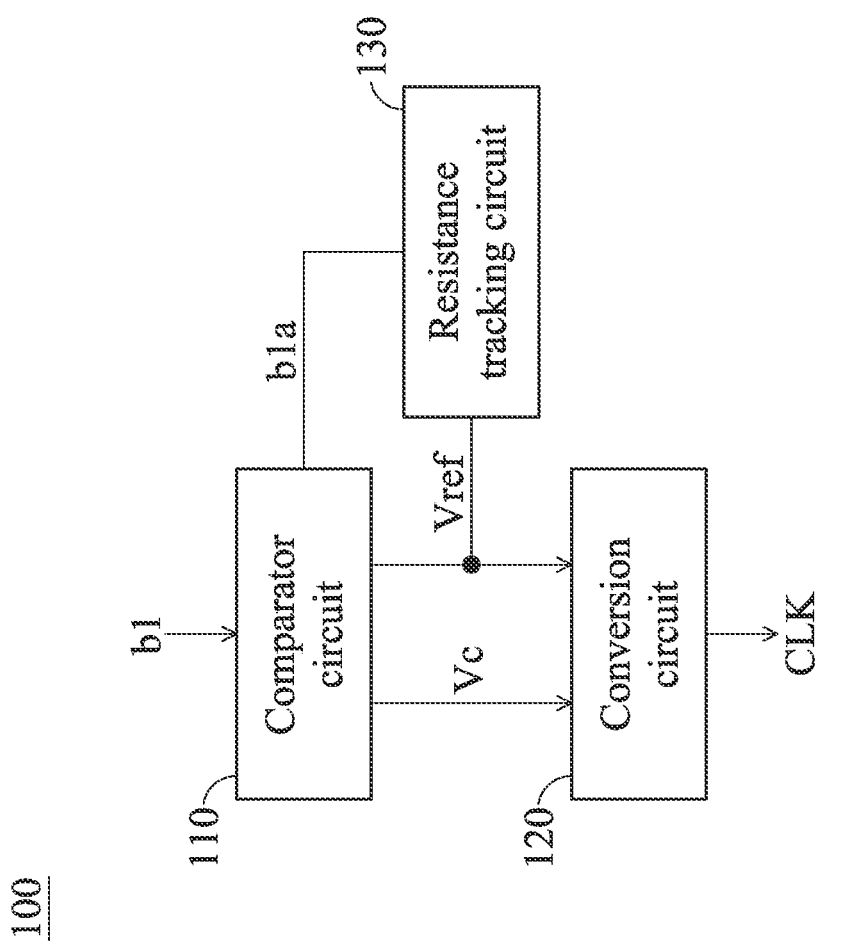
FIG. 1 is a schematic diagram of an exemplary embodiment of an oscillator circuit according to various aspects of the present disclosure.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

FIG. 1 is a schematic diagram of an exemplary embodiment of an oscillator circuit according to various aspects of the present disclosure. As shown in FIG. 1, the oscillator circuit 100 comprises a comparator circuit 110, a conversion circuit 120, and a resistance tracking circuit 130. The comparator circuit 110 compares the control signals b1 and b1a to generate an output voltage Vc. In some embodiments, the comparator circuit 110 also generates a reference voltage Vref.

The conversion circuit 120 converts the output voltage Vc to generate a clock signal CLK. In some embodiments, the conversion circuit 120 further receives the reference voltage Vref. In this case, the conversion circuit 120 compares the output voltage Vc and the reference voltage Vref. When the output voltage Vc is larger than the reference voltage Vref, the conversion circuit 120 reduces the output voltage Vc. When the output voltage Vc is smaller than the reference voltage Vref, the conversion circuit 120 increases the output voltage Vc.

The resistance tracking circuit 130 tracks the resistance of a variable resistor (not shown) to generate the control signal b1a. The position of the variable resistor is no limited in the present disclosure. In one embodiment, the variable resistor is disposed in the comparator circuit 110 or outside of the comparator circuit 110. In this case, the voltage of the variable resistor is provided as the reference voltage Vref. The variable resistor 130 obtains the resistance of the variable resistor according to the reference voltage Vref and adjusts the control signal b1a according to the resistance of the variable resistor.

Figure 2:
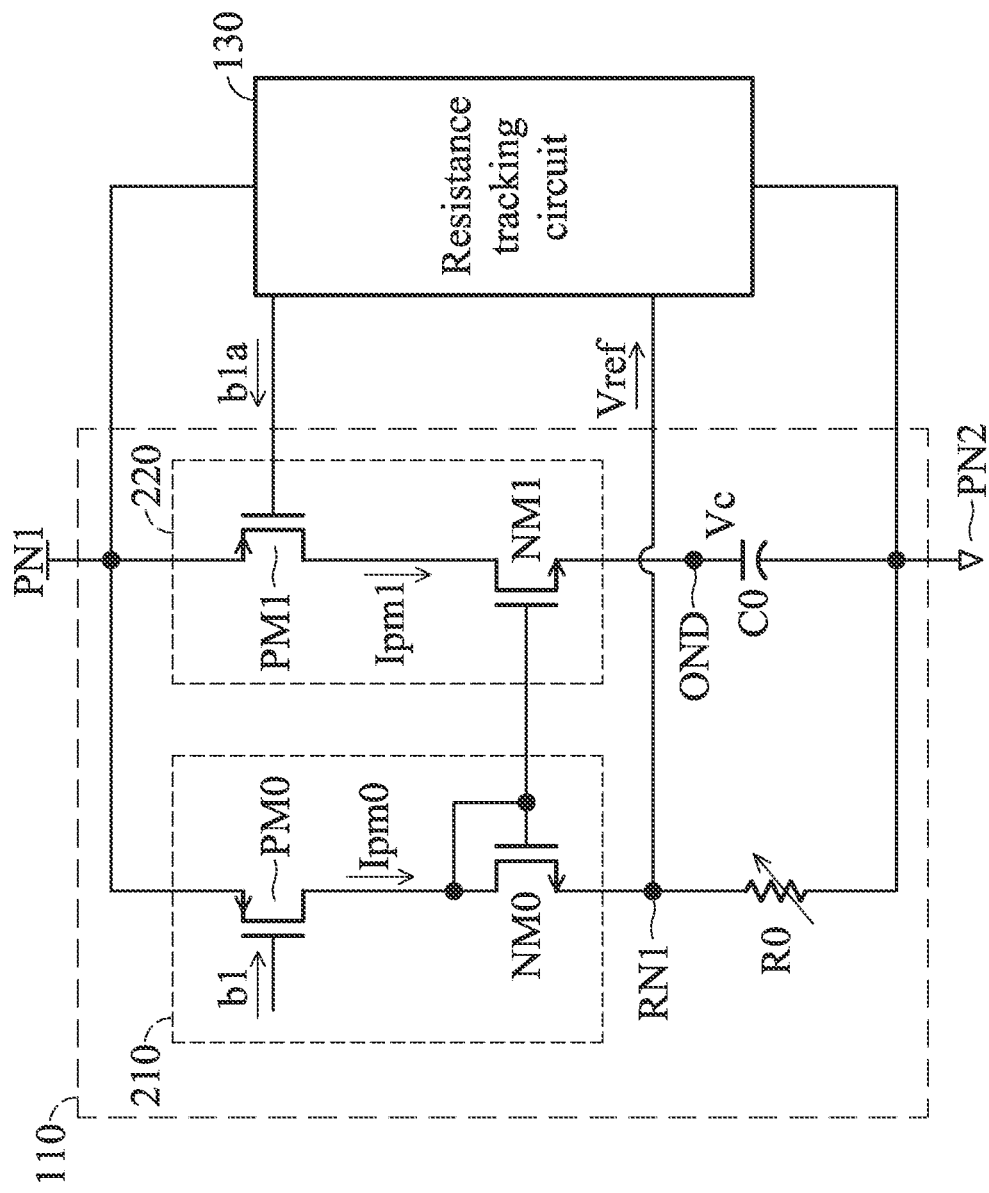
FIG. 2 is a schematic diagram of an exemplary embodiment of a comparator circuit according to various aspects of the present disclosure.

FIG. 2 is a schematic diagram of an exemplary embodiment of a comparator circuit according to various aspects of the present disclosure. As shown in FIG. 2, the comparator circuit 110 comprises current circuits 210 and 220, a variable resistor R0, and a capacitor C0. The current circuit 210 generates a current Ipm0 according to the control signal b1. In this embodiment, the current circuit 210 comprises transistors PM0 and NM0. In one embodiment, the transistor PM0 is a P-type transistor, and the transistor NM0 is an N-type transistor. The transistor PM0 is coupled in series to the transistor NM0 between the voltage node PN1 and the reference node RN1. The gate of the transistor PM0 receives the control signal b1. The source of the transistor PM0 is coupled to the voltage node PN1. The drain of the transistor PM0 is coupled to the drain of the transistor NM0. The gate and the drain of the transistor NM0 are coupled to the drain of the transistor PM0. The source of the transistor NM0 is coupled to the reference node RN1. In one embodiment, the transistor PM0 is served as a current source.

The current circuit 220 generates a current Ipm1 according to the control signal b1a. There is a proportional relationship between the currents Ipm1 and Ipm0. In one embodiment, the current Ipm1 is expressed by the following equation (1):

$$Ipm1 = m * Ipm0 \qquad \text{Equation (1).}$$

Wherein m is a constant.

In this embodiment, the current circuit 220 comprises transistors PM1 and NM1. The transistor PM1 is coupled to the transistor NM in series between the voltage node PN1 and the output node OND. In one embodiment, the transistor PM1 is a P-type transistor, and the transistor NM1 is an N-type transistor. The gate of the transistor PM1 receives the control signal b1a. The source of the transistor PM1 is coupled to the voltage node PN1. The drain of the transistor PM1 is coupled to the drain of the transistor NM1. The gate of the transistor NM1 is coupled to the gate of the transistor NM0. The source of the transistor NM1 is coupled to the output node OND.

In one embodiment, the proportional relationship between the sizes of the transistors PM1 and PM0 is similar to the proportional relationship between the currents Ipm1 and Ipm0. The size of the transistor means the length width (W/L) ratio of the channel of the transistor. In some embodiment, the current circuits 210 and 220 compose a current mirror.

The variable resistor R0 is coupled between the reference node RN1 and the voltage node PN2. In this embodiment, the variable resistor R0 generates a reference voltage Vref according to the current Ipm0. The reference voltage Vref is expressed by the following equation (2):

$$Vref = Ipm0 * R \qquad \text{Equation (2).}$$

Wherein R represents the resistance of the variable resistor R0.

The capacitor C0 is coupled between the output node OND and the voltage node PN2. In this embodiment, the capacitor C0 is charged according to the current Ipm1 to provide the output voltage Vc. The output voltage Vc is expressed by the following equation (3).

$$Vc = Ipm1 * T = C * Vref \qquad \text{Equation (3).}$$

Wherein T represents the charge time of the capacitor C0, and C represents the capacitance of the capacitor C0.

If we substitute equation (2) with equation (3), the substituted result is expressed by the following equation (4).

$$Ipm1 * T = C * (Ipm0 * R) \qquad \text{Equation (4).}$$

If we substitute equation (1) with equation (4), the substituted result is expressed by the following equation (5).

$$T = R * C / m \qquad \text{Equation (5).}$$

According to equation (5), the charge time of the capacitor C0 is related to the resistance of the variable resistor R0. Furthermore, the output voltage Vc is related to the charge time of the capacitor C0.

In some embodiments, the comparator circuit 110 provides the reference voltage Vref and the output voltage Vc to the conversion circuit 120. The conversion circuit 120 generates the clock signal CLK according to the reference voltage Vref and the output voltage Vc. In this case, the cycle of the clock signal CLK is related to the output voltage Vc and the output voltage Vc is related to the current Ipm1. If the current Ipm cannot meet the equation (1), the cycle of the clock signal CLK is easily affected by a process, a voltage and a temperature. Therefore, the resistance tracking circuit 130 tracks the resistance of the variable resistor R0 to generate the control signal b1a such that the current Ipm1 meets the equation (1).

As shown in FIG. 2, the resistance tracking circuit 130 is coupled between the voltage nodes PN1 and PN2. In this embodiment, the resistance tracking circuit 130 tracks the resistance of the variable resistor R0 to generate the control signal b1a. The present disclosure does not limit how the resistance tracking circuit 130 tracks the resistance of the variable resistor R0. In one embodiment, the resistance tracking circuit 130 obtains the resistance of the variable resistor R0 according to the reference voltage Vref.

In other embodiments, when the voltage node PN1 receives a first operation voltage and the voltage node PN2 receives a second operation voltage, the comparator circuit 110 starts operating. In such case, the first operation voltage is higher than the second operation voltage. In one embodiment, the second operation voltage is a ground voltage.

In some embodiments, the variable resistor R0 and the capacitor C0 are independently disposed outside of the comparator circuit 110. In this case, the variable resistor R0 receives the current Ipm0 generated by the comparator circuit 110. The voltage of the variable resistor R0 is served as the reference voltage Vref. The capacitor C0 receives the current Ipm1 generated by the comparator circuit 110 and is charged according to the current Ipm1. The voltage of the capacitor C0 is served as the output voltage Vc. In such case, the resistance tracking circuit 130 detects the voltage of the variable resistor R0 disposed outside of the comparator circuit 110 to generate the control signal b1a.

Figure 3:
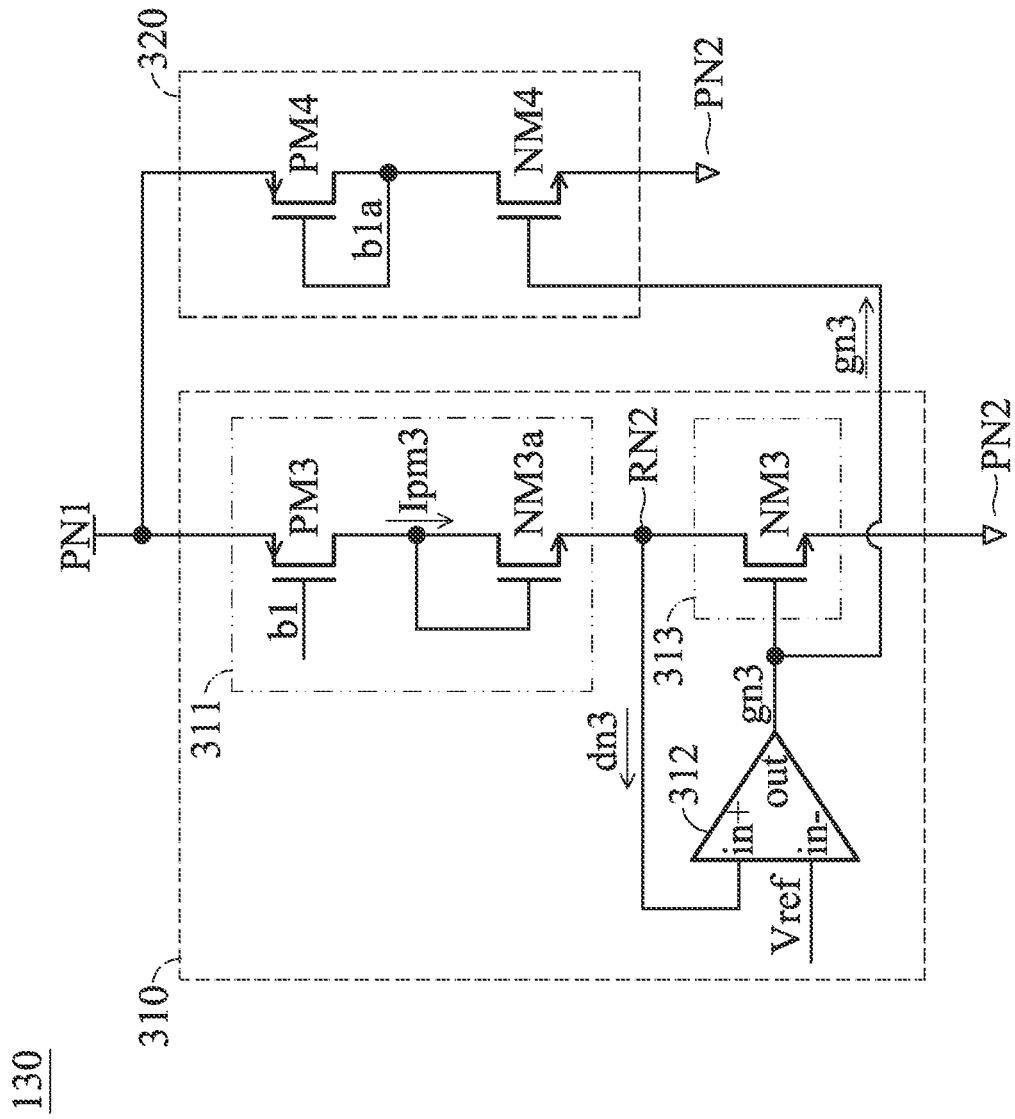
FIG. 3 is a schematic diagram of an exemplary embodiment of a resistance tracking circuit according to various aspects of the present disclosure.

FIG. 3 is a schematic diagram of an exemplary embodiment of the resistance tracking circuit according to various aspects of the present disclosure. The resistance tracking circuit 130 comprises a copy circuit 310 and a conversion circuit 320. The copy circuit 310 copies the current Ipm0 to generate a current Ipm3. In this case, the current Ipm3 is about equal to the current Ipm0. The copy circuit 310 generates a control signal gn3 according to the current Ipm3. The conversion circuit 320 generates the control signal b1a according to the control signal gn3.

In this embodiment, the copy circuit 310 comprises a current circuit 311, a comparator 312, and a conversion circuit 313. The current circuit 311 generates the current Ipm3 according to the control signal b1. The structure of the current circuit 311 is not limited in the present disclosure. In one embodiment, the current circuit 311 comprises transistors PM3 and NM3a. The size of the transistor PM3 is about equal to the size of the transistor PM0. Furthermore, the channel size of the transistor NM3a is about equal to the size of the transistor NM0. In some embodiments, the transistor PM3 is a P-type transistor, and the transistor NM3a is an N-type transistor.

The transistor PM3 is coupled in series to the transistor NM3a between the voltage node PN1 and the reference node RN2. The gate of the transistor PM3 receives the control signal b1. The source of the transistor PM3 is coupled to the voltage node PN1. The drain of the transistor PM3 is coupled to the drain of the transistor NM3a. The gate and the drain of the transistor NM3a are coupled to the drain of the transistor PM3. The source of the transistor NM3a is coupled to the reference node RN2.

The conversion circuit 313 is coupled between the reference node RN2 and the voltage node PN2 and receives the control signal gn3. In this embodiment, the conversion circuit 313 provides a reference voltage dn3 according to the current Ipm3. The structure of conversion circuit 312 is not limited in the present disclosure. Any circuit can serve as the conversion circuit 313, as long as the circuit is capable of converting a current into a voltage. In one embodiment, the conversion circuit 313 comprises a transistor NM3. In this case, the transistor NM3 is an N-type transistor. The gate of the transistor NM3 receives the control signal gn3. The drain of the transistor NM3 is coupled to the reference node RN2. The source of the transistor NM3 is coupled to the voltage node PN2.

The comparator 312 compares the reference voltages Vref and dn3 to generate the control signal gn3. In this embodiment, the non-inverting input in+ of the comparator 312 receives the reference voltage dn3. The inverting input in− of the comparator 312 receives the reference voltage Vref. The output out of the comparator 312 provides the control signal gn3.

The conversion circuit 320 generates the control signal b1a according to the control signal gn3. In this embodiment, the conversion circuit 320 comprises transistors PM4 and NM4. The transistor PM4 is coupled in series to the transistor NM4 between the voltage nodes PN1 and PN2. In some embodiments, the transistor PM4 is a P-type transistor, and the transistor NM4 is an N-type transistor. The gate of the transistor NM4 receives the control signal gn3. The source of the transistor NM4 is coupled to the voltage node PN2. The drain of the transistor NM4 is coupled to the drain of the transistor PM4. The gate and the drain of the transistor PM4 are coupled to the drain of the transistor NM4. The source of the transistor PM4 is coupled to the voltage node PN1. In some embodiments, the transistors PM0, PM4 and PM3 are the same size. Additionally, the transistors NM4 and NM3a are the same size.

Figure 4:
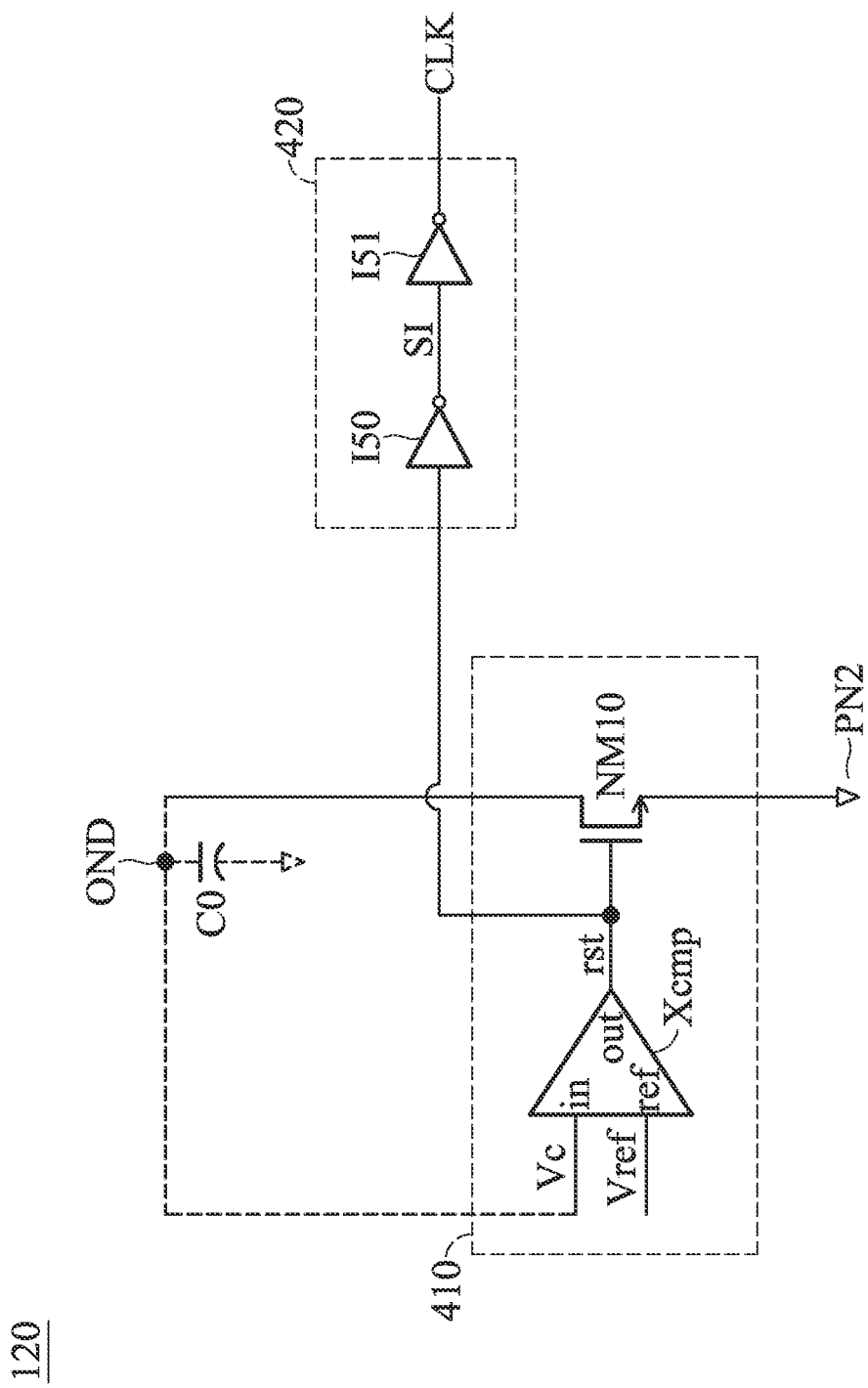
FIG. 4 is a schematic diagram of an exemplary embodiment of a conversion circuit according to various aspects of the present disclosure.

FIG. 4 is a schematic diagram of an exemplary embodiment of a conversion circuit according to various aspects of the present disclosure. The conversion circuit 120 comprises a regulation circuit 410 and a shaping circuit 420. In this embodiment, the conversion circuit 120 is coupled to the reference node RN1 and the output node OND to receive the reference voltage Vref and the output voltage Vc.

The regulation circuit 410 generates an adjustment signal rst according to the reference voltage Vref to adjust the output voltage Vc. In this embodiment, the regulation circuit 410 comprises a comparator Xcmp and a discharging transistor NM10. The comparator Xcmp compares the reference voltage Vref and the output voltage Vc to generate the adjustment signal rst. The discharging transistor NM10 reduces the output voltage Vc according to the adjustment signal rst. For example, when the adjustment signal rst is at a first level (e.g., a high level), the discharging transistor NM10 is turned on to discharge the capacitor C0. Therefore, the output voltage Vc is gradually reduced. When the adjustment signal rst is at a second level (e.g., a low level), the discharging transistor NM10 is turned off. At this time, the capacitor C0 may be charged according to the current Ipm1 such that the output voltage Vc is gradually increased. In some embodiments, the discharging transistor NM10 is an N-type transistor.

The shaping circuit 420 generates the clock signal CLK according to the adjustment signal rst. In one embodiment, the adjustment signal rst is a triangular wave signal, and the clock signal CLK is a square wave signal. In this embodiment, the shaping circuit 420 comprises inverters 150 and 151. The inverter 150 inverts the adjustment signal rst to generate an inverted signal SI. The inverter 151 inverts the inverted signal SI to generate the clock signal CLK.

It will be understood that when an element or layer is referred to as being "coupled to" another element or layer, it can be directly coupled to the other element or layer or intervening elements or layers may be present. In contrast, when an element or layer is referred to as be "connected to" another element or layer, there are no intervening elements or layers present.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. It will be understood that although the terms "first," "second," etc. may be used herein to describe various elements, these elements should not be limited by these terms. These terms are only used to distinguish one element from another.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A resistance tracking circuit coupled to a comparator circuit comprising a first current circuit which generates a first current according to a first control signal, a second current circuit which generates a second current according to a second control signal, a variable resistor which generates a first reference voltage according to the first current, and a capacitor which is charged by the second current to generate an output voltage, wherein the resistance tracking circuit comprises:

a first conversion circuit generating the second control signal according to a third control signal; and a copy circuit copying the first current, generating the third control signal, and comprising:

a third current circuit generating a third current equal to the first current according to the first control signal;

a second conversion circuit providing a second reference voltage according to the third current; and a comparator comparing the first reference voltage and the second reference voltage to generate the third control signal.

2. The resistance tracking circuit as claimed in claim 1, wherein the third current circuit comprises:

a first P-type transistor receiving the first control signal; and a first N-type transistor coupled to the first P-type transistor in series between a first voltage node and a first reference node.

3. The resistance tracking circuit as claimed in claim 2, wherein a gate and a drain of the first N-type transistor are coupled to a drain of the first P-type transistor.

4. The resistance tracking circuit as claimed in claim 2, wherein the first current circuit comprises:

a second P-type transistor; and a second N-type transistor coupled to the second P-type transistor in series between the first voltage node and the variable resistor, wherein the first P-type transistor and the second P-type transistor are the same size, and the first N-type transistor and the second N-type transistor are the same size.

5. The resistance tracking circuit as claimed in claim 4, wherein the second conversion circuit comprises:

a third N-type transistor comprising a gate receiving the third control signal and a drain coupled to the first reference node.

6. The resistance tracking circuit as claimed in claim 5, wherein the first P-type transistor, the first N-type transistor, and the third N-type transistor are coupled to each other in series between the first voltage node and a second voltage node.

7. The resistance tracking circuit as claimed in claim 6, wherein the first conversion circuit comprises:

a fourth N-type transistor generating the second control signal according to the third control signal; and a third P-type transistor connected to the fourth N-type transistor in series.

8. The resistance tracking circuit as claimed in claim 7, wherein a gate and a drain of the third P-type transistor are coupled to a drain of the fourth N-type transistor.

9. The resistance tracking circuit as claimed in claim 7, wherein a size of the third P-type transistor is the same as a size of the first P-type transistor, and a size of the fourth N-type transistor is the same as a size of the first N-type transistor.

10. The resistance tracking circuit as claimed in claim 7, wherein the fourth N-type transistor is connected to the third P-type transistor in series between the first voltage node and the second voltage node.

11. An oscillator circuit generating a clock signal and comprising:

a regulation circuit generating an adjustment signal according to a first reference voltage to adjust an output voltage;

a shaping circuit generating the clock signal according to the adjustment signal; and a comparator circuit providing the first reference voltage and the output voltage and comprising:

a first current circuit generating a first current according to a first control signal;

a second current circuit generating a second current according to a second control signal;

a variable resistor generating the first reference voltage according to the first current;

a capacitor charged by the second current to generate the output voltage; and a resistance tracking circuit tracking a resistance of the variable resistor to generate the second control signal and comprising:

a copy circuit copying the first current and generating a third control signal; and a first conversion circuit generating the second control signal according to the third control signal.

12. The oscillator circuit as claimed in claim 11, wherein the regulation circuit comprises:

a first comparator comparing the first reference voltage and the output voltage to generate the adjustment signal; and a discharging transistor reducing the output voltage according to the adjustment signal.

13. The oscillator circuit as claimed in claim 12, wherein the shaping circuit comprises:

a first inverter inverting the adjustment signal to generate an inverted signal; and a second inverter inverting the inverted signal to generate the clock signal.

14. The oscillator circuit as claimed in claim 11, wherein the first current circuit comprises:

a first transistor receiving the first control signal; and a second transistor coupled to the first transistor in series between the first voltage node and a first reference node, wherein the variable resistor is coupled between the first reference node and a second voltage node.

15. The oscillator circuit as claimed in claim 14, wherein the second current circuit comprises:

a third transistor receiving the second control signal; and a fourth transistor coupled to the third transistor in series between the first voltage node and an output node, wherein the capacitor is coupled between the output node and the second voltage node, and a gate of the fourth transistor is coupled to a gate and a drain of the second transistor.

16. The oscillator circuit as claimed in claim 15, wherein the discharging transistor comprises:

a gate receiving the adjustment signal;

a drain receiving the output voltage; and a source coupled to the second voltage node.

17. The oscillator circuit as claimed in claim 15, wherein the resistance tracking circuit comprises:

a fifth transistor receiving the second control signal;

a sixth transistor coupled to the fifth transistor in series between the first voltage node and the second voltage node.

18. The oscillator circuit as claimed in claim 17, wherein a size of the fifth transistor is the same as a size of the first transistor, and a size of the sixth transistor is the same as a size of the second transistor.

19. The oscillator circuit as claimed in claim 17, wherein the copying circuit comprises:

a seventh transistor receiving the first control signal;

an eighth transistor receiving the third control signal;

a ninth transistor coupled to the seventh transistor and the eighth transistor in series; and a second comparator comparing the first reference voltage and the second reference voltage to generate the third control signal and providing the third control signal to the ninth transistor.

20. The oscillator circuit as claimed in claim 19, wherein a size of the seventh transistor is the same as a size of the first transistor, and a size of the ninth transistor is the same as a size of the second transistor.

* * * * *